(12) United States Patent
Buchhauser et al.

(10) Patent No.: US 7,994,715 B2
(45) Date of Patent: Aug. 9, 2011

(54) ORGANIC LIGHT-EMITTING COMPONENT WITH AN ANTENNA COIL

(75) Inventors: Dirk Buchhauser, Penang (MY); Christoph Gaerditz, Erlangen (DE); Karsten Heuser, Erlangen (DE); Wiebke Sarfert, Herzogenaurach (DE); Carsten Tschamber, Hamburg (DE); Oliver Weiss, Erlangen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 925 days.

(21) Appl. No.: 11/755,558

(22) Filed: May 30, 2007

(65) Prior Publication Data

US 2008/0042558 A1 Feb. 21, 2008

(30) Foreign Application Priority Data

May 30, 2006 (DE) .......................... 10 2006 025 115
Jul. 20, 2006 (DE) .......................... 10 2006 033 713

(51) Int. Cl.
*H01J 1/88* (2006.01)
(52) U.S. Cl. .......................... 313/509; 313/504; 313/506
(58) Field of Classification Search .......... 313/498–512; 315/169.1, 169.3; 428/690–691, 971; 438/26–29, 438/34, 82; 257/40, 72, 98–100, 642–643, 257/759; 427/66, 532–535, 539
See application file for complete search history.

(56) References Cited

U.S. PATENT DOCUMENTS

| | | | |
|---|---|---|---|
| 6,541,294 B1 * | 4/2003 | Yamazaki et al. | ............... 438/29 |
| 6,949,880 B1 | 9/2005 | Guenther et al. | |
| 6,952,078 B1 | 10/2005 | Guenther | |
| 7,202,547 B2 | 4/2007 | Klauk et al. | |
| 7,713,800 B2 * | 5/2010 | Kusumoto et al. | ............. 438/151 |
| 2004/0048033 A1 | 3/2004 | Klausmann et al. | |
| 2004/0051449 A1 | 3/2004 | Klausmann et al. | |
| 2004/0239241 A1 | 12/2004 | Wittmann et al. | |
| 2005/0017628 A1 * | 1/2005 | Prakash | ........................ 313/504 |
| 2005/0130389 A1 * | 6/2005 | Yamazaki et al. | ............. 438/455 |
| 2005/0140015 A1 * | 6/2005 | Shionoiri et al. | ............. 257/773 |
| 2005/0140291 A1 * | 6/2005 | Hirakata et al. | ............. 313/512 |
| 2005/0148121 A1 * | 7/2005 | Yamazaki et al. | ............. 438/149 |
| 2005/0158523 A1 | 7/2005 | Gupta et al. | |
| 2005/0260777 A1 | 11/2005 | Brabec et al. | |
| 2006/0105493 A1 | 5/2006 | Hunze et al. | |
| 2006/0175603 A1 | 8/2006 | Schmid et al. | |
| 2006/0246693 A1 * | 11/2006 | Tanaka et al. | ............. 438/487 |
| 2006/0261331 A1 * | 11/2006 | Yukawa | ............. 257/40 |

FOREIGN PATENT DOCUMENTS

| | | |
|---|---|---|
| DE | 103 28 811 A1 | 1/2005 |
| DE | 10 2004 005 082 A1 | 8/2005 |
| DE | 10 2004 057 760 A1 | 6/2006 |
| EP | 1 296 388 | 3/2003 |
| EP | 1 437 683 | 7/2004 |

(Continued)

*Primary Examiner* — Joseph L Williams
*Assistant Examiner* — Fatima N Farokhrooz
(74) *Attorney, Agent, or Firm* — Fish & Richardson P.C.

(57) ABSTRACT

An organic light-emitting component, having a substrate, a first electrode arranged on the substrate, a layer stack that is arranged on the first electrode and that has at least one organic layer and a second electrode arranged on the layer stack. The layer stack is suitable for emitting electromagnetic radiation during operation. The component also has a receiver device, which is suitable for drawing energy from an alternating electromagnetic field and for converting this energy at least partially into electrical energy and for making this energy available to the layer stack.

25 Claims, 6 Drawing Sheets

FOREIGN PATENT DOCUMENTS

| | | |
|---|---|---|
| JP | 2000-164364 | 6/2000 |
| JP | 2002-27061 | 1/2002 |
| JP | 2002-95517 | 4/2002 |
| JP | 2002-314655 | 10/2002 |
| JP | 2002-366059 | 12/2002 |
| JP | 2002366059 A * | 12/2002 |
| JP | 2005-236762 | 9/2005 |
| WO | WO 99/07189 A1 | 2/1999 |
| WO | WO 01/44865 A1 | 6/2001 |
| WO | WO 01/45140 A2 | 6/2001 |
| WO | WO 2004/107468 A2 | 12/2004 |
| WO | WO 2006/058858 A2 | 6/2006 |

* cited by examiner

ORGANIC LIGHT-EMITTING COMPONENT WITH AN ANTENNA COIL

CROSS-REFERENCE TO RELATED APPLICATIONS

This application claims the priority of the German Patent Application Nos. 102006025115.6 and 102006033713.1, filed May 30, 2006, and Jul. 20, 2006, respectively.

BACKGROUND

Light-emitting components and methods for producing such components are described.

Organic light-emitting components usually have organic materials that can easily react with water and oxygen, which usually leads to accelerated degradation of the components. In order to avoid contact between the organic materials and water and oxygen, organic light-emitting components are typically encapsulated, as described, for example, in WO 01/45140 A2.

In conventional organic light-emitting components, electrically conductive lines lead outward from the components through or under an encapsulation for providing electrical contact to the component. The electrically conductive lines end at electrical contact surfaces, with which the component can be connected to driver electronics. Where the conductive lines lead through or under the encapsulation, a satisfactory seal of the encapsulation can be difficult to achieve. The conductive lines can act as permeation channels and allow water, oxygen, or other corrosive materials to penetrate from the outside to the organic materials.

SUMMARY

Degradation due to reactions with water, atmospheric oxygen, or the like, can be reduced using the devices and techniques described herein. An organic light-emitting component includes a substrate on which an organic light emitting device is located and a receiver suitable for drawing energy from an alternating electromagnetic field, for converting the energy into electrical energy and transferring the energy to the organic light emitting device.

A method for producing an organic light-emitting component, which has at least one layer that includes an organic material and that is suitable for generating electromagnetic radiation includes producing a layer stack on a substrate. The substrate and the layer stack are encapsulated, wherein the encapsulation is applied such that the outer surface of the component is free from electrical contact surfaces.

The method can advantageously allow the production of an especially well encapsulated organic light-emitting component. In addition, the method eliminates the exposure of electrical contact surfaces on the outer surface of the component in connection with the production of the layer stack, which is required in the production of conventional components and which can increase production time and costs.

Figure 1A:
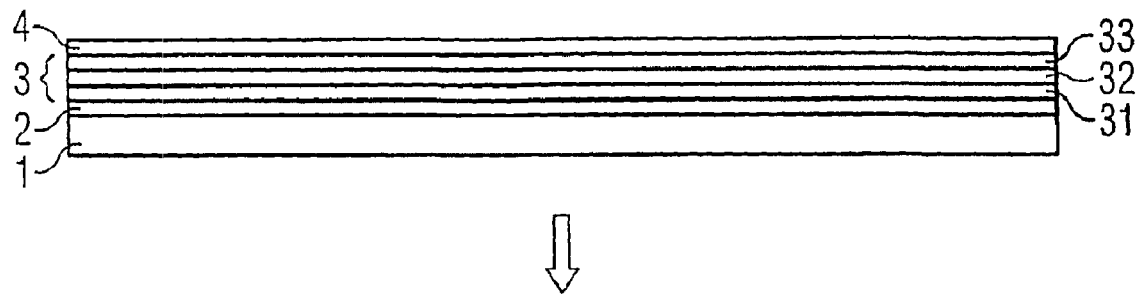
FIGS. 1A-1F are schematic cross sections through a plurality of organic light-emitting components at various stages of formation.
Figure 1A:

In the embodiments and figures, components that are identical or that have identical functions are each provided with identical reference symbols. The illustrated elements and their size ratios relative to each other are, in principle, not to be viewed as true to scale, but instead individual elements, e.g., layers and/or edges, can be illustrated excessively thick or large for better representation and/or for better understanding.

DETAILED DESCRIPTION

An organic light-emitting component includes a substrate, a first electrode, a layer stack, which has at least one layer that includes an organic material and that is suitable for emitting electromagnetic radiation during operation, a second electrode, and receiver device that is suitable for drawing energy from an alternating electromagnetic field and for converting this energy at least partially into electrical energy.

The substrate includes or is formed entirely of, for example, at least one of the following materials: glass, a semiconductor material, such as silicon, a metal, such as steel or stainless steel, or a plastic, such as poly(ethylene terephthalate) (PET), poly(butylene terephthalate) (PBT), poly(ethylene naphthalate) (PEN), polycarbonate (PC), polyimide (PI), polysulfone (PSO), poly(p-phenylene ethersulfone) (PES), polyethylene (PE), polypropylene (PP), poly(vinyl chloride) (PVC), polystyrene (PS), or poly(methylmethacrylate) (PMMA).

The substrate can be in the form of a plate or a film. In some embodiments, the substrate is a glass plate. In one embodiment, the glass plate has a thickness of greater than or equal to 0.5 mm and/or less than or equal to 3 mm. For example, the glass plate can have a thickness of about 1 mm. In some embodiments, the substrate is very thin and/or flexible. For example, a flexible substrate is a thin glass plate with a thickness between about 50 and 100 μm. In some embodiments, the thin and/or flexible substrate is a film that includes metal and/or a plastic. The film has, for example, a thickness between about 50 and 400 μm, such as between about 100 and 200 μm. Thus, for example, light and/or flexible components can be formed.

If at least part of the radiation generated by the layer stack in operation is to be transmitted through the substrate, the substrate can include a material that is at least partially transparent or translucent to the radiation emitted by the layer stack.

The first electrode is deposited over or directly on the substrate. The first electrode can be either an anode or a cathode. If the first electrode is the anode, then it can include a material that possesses high electron work function, such as greater than or equal to 4.5 eV. The anode may include, for example, a metal such as Pt, Au, In, and/or Pd, a transparent, conductive oxide, especially indium-tin oxide (ITO), lead oxide, and/or tin oxide, LiF and/or graphite, an inorganic semiconductor material, such as Si, Ge, or GaAs, and/or a conductive polymer such as polypyrrole, polyaniline (PANI), and/or poly-3,4-ethylene dioxythiophene (PEDOT).

If the first electrode is the cathode, it can include a material with low electron work function. For example, the cathode can include Ca, Mg, a magnesium alloy such as Mg:Ag, Yb, Ba, an aluminum alloy such as Li:Al, or a combination made from at least two of these materials.

In some embodiments, the thickness and/or material of the first electrode is selected so that radiation emitted by the layer stack during operation is transmitted at least partially through the first electrode. If the first electrode is an anode, suitable materials are, for example, transparent conductive oxides, which are usually at least partially translucent or transparent to the radiation emitted by the layer stack during operation.

Alternatively or in addition, the electromagnetic radiation generated by the layer stack during operation can be transmitted through the second electrode, which is deposited on the side of the layer stack opposite the first electrode. In some embodiments, the first electrode also comprises a metallic layer with good reflection properties for the radiation emitted by the layer stack. For example, the metallic layer can include Ag, Al, Mg, Ca, Pt, and/or an alloy that includes at least two of these metals.

The second electrode can be either the cathode or the anode. If the first electrode is an anode, then the second electrode is a cathode and vice versa. Suitable materials correspond to those described for the first electrode. In some embodiments, the cathode includes a first layer, which includes at least one alkali metal and/or one earth alkali metal. In some embodiments, the cathode also includes a second layer that includes a metal, for example, Al, Ag, and/or Au.

The layer stack is deposited over or directly on the first electrode. The layer stack includes at least one layer and has at least one organic material. The organic material includes, e.g., a low-molecular weight material ("small molecules") and/or a polymer.

The layer stack includes a layer that emits light during operation and includes an emitter material, especially an organic emitter material. Suitable emitter materials include, for example, photoluminescent and/or electroluminescent, fluorescent, and phosphorescent organic materials with low or high molecular weight. The light that is emitted can be infrared, visible and/or ultraviolet light.

Suitable materials with low molecular weight (small molecule materials) are, for example, tris-8-aluminum-quinolinol complexes such as tris-(8-hydroxy-chinolinato)-aluminum ($Alq_3$), 1,4-bis(2,2-diphenyl vinyl)biphenyl (DPVBi) and coumarines.

Suitable organic materials with high molecular weight are, for example, organic or organometallic polymers. These include polyfluorene, polythiophene, polyphenylene, polythiophene vinylene, poly-p-phenylene vinylene (PPV), polyspiro polymers and their families, copolymers, derivatives, and mixtures thereof.

In one embodiment, the layer stack also comprises a hole transport layer adjacent to the anode and/or an electron transport layer adjacent to the cathode. Such hole or electron transport layers are described, for example, in US 2005/0158523 A1, the contents of which is incorporated by reference herein. The hole transport layer includes, for example, PEDOT, 4,4',4"-tris(N-(1-naphthyl)-N-phenyl-amino)-triphenylamine (1-naphDATA), and/or 4,4'-bis[N-(1-naphtyl)-N-phenyl-amino]biphenyl ($\alpha$-NPD) or is composed entirely of at least one of these materials. The electron transport layer includes or is composed entirely of, for example, 4,7-diphenyl-1,10-phenantroline (BPhen), and/or $Alq_3$.

The organic light-emitting component is exposed to an alternating electromagnetic field during operation. The alternating electromagnetic field can be a time-varying electric and/or magnetic field. In some embodiments, the time variation is periodic. For example, the alternating electromagnetic field can be a high-frequency field or microwaves. In one embodiment, the alternating electromagnetic field has a frequency between about 30 and 500 kHz, in another embodiment, a frequency between about 10 and 15 MHz.

The receiver device draws energy from the alternating electromagnetic field. The alternating electromagnetic field that the receiver is configured to receive and convert can be microwaves and/or radio waves, that is, electromagnetic energy with wavelengths longer than the wavelength of infrared light. The microwaves can be electromagnetic waves having a wavelength of longer than about $10^{-4}$ m, such as longer than about $10^{-3}$ meters and the radio waves can have a wavelength of longer than about $10^{-1}$ meters. The receiver device is suitable for at least partially converting the energy drawn from the alternating electromagnetic field into electrical energy and for applying a current to the layer stack. Thus, the receiver device in operation makes available to the layer stack the electrical energy required for radiation emission. For this purpose, the receiver device can be connected to the first and to the second electrode in an electrically conductive way.

In some embodiments, the receiver device includes a coil, such as a micro-coil, and/or an antenna, which is provided for capturing electromagnetic energy from the alternating electromagnetic field. An alternating electromagnetic field usually induces a voltage in the coil and/or the antenna, which generates a current through the layer stack in a circuit closed by the layer stack and optionally by other electrical and/or electronic components. A micro-coil has, for example, in cross section, a height of less than or equal to 2 mm, such as less than or equal to 1 mm and/or a width of less than or equal to 5 mm, such as less than or equal to 3 mm. The length of a micro-coil equals between about 20 mm and 50 mm in some embodiments; for example, in one embodiment, the micro-coil length equals 30 mm. In at least one embodiment, the micro-coil has a ferrite core.

A device (for example, a storage battery) that stores or accumulates the energy drawn by the receiver device from the alternating electromagnetic field over a longer time span—that is for a longer duration than one or a few periods of the alternating electromagnetic field—is not necessary for the operation of the component. Instead, the layer stack is preferably supplied with power practically in real time with the energy drawn from the alternating electromagnetic field.

The coil or antenna is arranged, for example, on the substrate, in particular, the coil or antenna does not project past the substrate in a plan view onto the main surface of the substrate, i.e., the coil does not extend beyond an edge of the substrate. In some embodiments, the coil or antenna is embedded in the substrate.

In one embodiment, the coil or antenna is arranged next to the layer stack on the substrate. In another embodiment of the component, an insulating layer is deposited on the second electrode and at least partially covers the second electrode. The antenna can be arranged at least partially on the insulating layer. For example, the antenna comprises one or more conductive lines. The conductive line or lines are vapor deposited onto the insulating layer in some embodiments. The conductive line or lines can also extend onto the first and/or second electrode.

The antenna or coil has, for example, the shape of a spiral, for example, a triangular, rectangular, hexagonal, or octagonal spiral. For a triangular, hexagonal, or octagonal spiral, a winding of the spiral has three, six, or eight corners. The corners of one or more windings of the spiral are rounded in some embodiments. Other geometries are also conceivable for the antenna.

In some embodiments, the antenna has two ends, of which, for example, a first end is connected to the first electrode and a second end is connected to the second electrode. Alternatively, at least one additional electrical or electronic component of the receiver device can be arranged between the first end of the antenna and the first electrode and/or between the second end of the antenna and the second electrode. Here, the additional component can be, for example, a resistor, a diode, a capacitor, a coil, and/or a circuit made from several components.

In some embodiments, the insulating layer covers an edge region of the second electrode and leaves exposed a middle area of the second electrode. In some embodiments, the second end of the antenna is then deposited onto the middle area of the second electrode and is electrically connected to the middle area. In one variant of this embodiment, an edge region of the second electrode remains uncovered by the insulating layer. In some embodiments of this variant, the second end of the antenna is arranged on the uncovered edge region and is electrically connected to the second electrode.

The insulating layer includes an insulating material, such as $Al_2O_3$, polytetrafluoroethylene, polystyrene (PS), and/or poly(methyl methacrylate) (PMMA) or is composed entirely of one of these materials.

Alternatively, the insulating layer can also be a self-assembled monolayer. A self-assembled monolayer can contain molecular groups. In particular, it is composed of a monolayer of molecular groups. A molecular group includes, for example, an anchor group, which is suitable for connecting to the second electrode. In one embodiment, the molecular group also includes a dielectric unit, which is arranged downstream of the anchor group on the side of the self-assembled monolayer away from the second electrode. Such self-assembled monolayers and molecular groups are described, for example, in the publications DE 103 28 811 A1, DE 10 2004 005 082 A1, and DE 10 2004 057 760 A1, the contents of which are incorporated herein by reference. An insulating layer, which is a self-organizing monolayer made from molecular groups, can be produced particularly easily and has no or only a few defects at which the second electrode is not covered. It also has advantageously a particularly high electrical resistance.

If the antenna is arranged on an insulating layer, which at least partially covers the second electrode, the radiation generated by the layer stack during operation can be transmitted through the first electrode and the substrate (a so called "bottom-emitter device").

In another embodiment, the electromagnetic radiation, e.g., infrared, visible and/or ultraviolet light, generated by the layer stack in operation is at least partially transmitted through the second electrode (a so called "top-emitter device").

In some embodiments, the antenna comprises a material that is at least partially transparent to the electromagnetic radiation emitted by the layer stack, in particular, a transparent conducting oxide (TCO) such as indium-tin oxide (ITO) and/or a thin metal layer. In this case, at least one part of the electromagnetic radiation can be transmitted through the antenna.

Alternatively, radiation emitted by the layer stack in operation can also be transmitted through a first and/or second electrode, on which an antenna is arranged, even when the antenna is essentially not transparent. In this case, the radiation is only transmitted through the portions of the electrode not covered by the antenna. For example, when the antenna covers only a small part, e.g., an edge region, of the area of the radiation-emitting layer stack, electromagnetic radiation from the main portion of the layer stack is not blocked by the antenna.

In another embodiment, the antenna is arranged between the substrate and the first electrode. An insulating layer, which at least partially covers the first electrode, is arranged between the antenna and the first electrode. In this embodiment, the electromagnetic radiation generated by the layer stack during operation can be at least partially transmitted through the second electrode.

In one embodiment, the receiver device is suitable for rectifying alternating current. For this purpose, the receiver device includes, for example, at least one diode. In one embodiment, the diode is connected in series with the coil or antenna and the layer stack. In another embodiment, the receiver device includes a rectifier bridge, e.g., a full-wave bridge with four diodes.

In some embodiments, the receiver device comprises at least one capacitor, which is used, for example, for smoothing the voltage or the current. Advantageously, a very constant direct current can be injected into the layer stack, resulting in a very uniform emission. In one embodiment, the receiver device comprises an oscillating circuit, which comprises at least the antenna and/or the coil and a capacitor. In some embodiments, the resonance frequency of the oscillating circuit is tuned to the frequency of the alternating electromagnetic field. Thus, energy is efficiently drawn from the alternating electromagnetic field.

In some embodiments, the diode, capacitor, and/or optionally other electronic components contained in the receiver device are miniaturized.

In some embodiments, a layer structure is arranged on the substrate that includes the diode, the capacitor, and/or other electronic components. The layer structure includes, for example, at least one organic semiconductor layer, one inorganic semiconductor layer, and/or one metal layer. In particular, the layer structure is vapor deposited or deposited by means of molecular beam epitaxy (MBE). The organic and/or inorganic semiconductor layer and/or the metal layer are structured, such as by photolithography. Semiconductor processing techniques can be used to form an integrated circuit of the semiconductor and/or metal layers. Thus, an especially small sized organic light-emitting component is possible.

The diode, the capacitor, and/or optionally other electronic components are arranged, for example, on the substrate next to and/or above the layer stack. In some embodiments, the layer structure is arranged between the first electrode and the substrate or on an area of the substrate uncovered by the layer stack, that is, laterally next to the layer stack. Alternatively, the layer structure is arranged on the organic layer stack, on its side remote from the substrate.

In some embodiments, the organic light-emitting component is encapsulated. An encapsulating structure, such as a laminate or cap, is arranged on the substrate such that it covers and surrounds the layer stack, and together with the substrate forms an encapsulation. In other words, the substrate and the encapsulating structure completely surround an interior cavity in which the layer stack is arranged. Thus, contact of the layer stack, especially the organic material in the layer stack, with corrosive substances, such as water or oxygen, is prevented.

In some embodiments, the encapsulation is a cap. The cap can include or can be formed entirely of glass, a ceramic, a plastic, or a combination thereof. In some embodiments, the cap includes, for example, a color filter and/or a fluorescence conversion material. In some embodiments, the cap has no direct contact with the layer stack. Spacer particles and/or support posts can prevent contact between the cap and the layer stack, as described, for example, in the publications U.S. Pat. Nos. 6,949,880 and 6,952,078, the contents of which are incorporated by reference. In some embodiments, a better material, for example, barium, is deposited on the side of the cap facing the layer stack. The better material is suitable, in particular, for chemically or physically binding gasses that could damage the layer stack. Such better materials are described, for example, in the publications US 2004/0051449 and US 2004/0048033, the contents of which are incorporated herein by reference.

A bonding agent arranged between the substrate and an edge region of the cap connects the cap to the substrate in a mechanically stable way in some embodiments. In some embodiments, the bonding agent is essentially impermeable to water and oxygen or other oxidizing substances, thereby creating a hermetically sealed device. For example, a bonding agent on the basis of epoxy resin or solder glass can be used.

In an alternative embodiment, the organic light-emitting component is encapsulated with a laminate including at least one polymer and one inorganic layer, such as with an alternating sequence of several of such layers. For example, such a sequence of polymer and inorganic layers includes at least one active polymer layer, which can be suitable for binding moisture and/or oxidizing substances, and at least one ceramic layer. One such layer sequence is disclosed, for example, in the publication U.S. Publication No. 2004/0239241, the contents of which are incorporated by reference. In at least one embodiment, such encapsulation is very thin and/or flexible. Advantageously, a component with an especially small overall height is achieved with such a thin-film encapsulation. In addition, advantageously the production of a flexible component is possible.

In some embodiments, the encapsulating structure completely covers the substrate in a plan view onto the substrate. In some embodiments, the substrate and the encapsulating structure have edges that are arranged flush relative to each other in a plan view onto the substrate. This means that the substrate and the encapsulation have the same exterior measurements in a plan view of the main surface and are congruent with one another, that is, the substrate and encapsulation have the same length and width. As an alternative to the flush arrangement, the encapsulating structure can also project past the edge of the substrate in a plan view onto the substrate. One part of the encapsulating structure in this case is arranged laterally next to the substrate in the plane of the main surface of the substrate and partially or completely covers a side or edge face of the substrate. The side or edge face is not parallel to the plane of the main extent. In some embodiments, the side face is a circumferential side face, i.e., the side face or faces completely surround the substrate in a top view on the plane of the main surface. In some embodiments, the encapsulating structure is bonded to the side face of the substrate with a bonding agent. For example, the encapsulating structure can have a peripheral step or recess for holding the substrate. In the area of the step, the side of the substrate facing the layer stack and the side face of the substrate can be adhered to the encapsulating structure with a bonding agent.

In some embodiments, the outer surface of the encapsulated component has no electrical contact surfaces. The outer surface is here the part of the surface of the component facing away from the interior, especially the faces of the substrate and the encapsulating structure facing away from the layer stack. In other words, no electrical connections and/or conductive lines lead out from the interior, which contains the layer stack and which is enclosed by the encapsulating structure and the substrate.

Advantageously, such a component has no electrical feedthroughs between the interior and the exterior. Such electrical feedthroughs can create, for example, diffusion channels, which permit the penetration of water and/or oxygen or other oxidizing substances into the interior and thus accelerate the aging of the component. In an organic light-emitting component without external electrical contact surfaces, advantageously an active, i.e., radiation emitting, area that is particularly large in comparison with the base surface area of the substrate is also possible, because, for example, no subarea of the substrate must remain free from the layer stack for forming external electrical contact surfaces.

In some embodiments, the receiver device can be used to detect an alternating electromagnetic field of a predetermined wavelength or a predetermined wavelength range. The organic light-emitting component is then used, for example, as an optically emitting high-frequency sensor. The receiver device then directs current into the layer stack, so that the stack emits electromagnetic radiation, e.g., light in the visible spectral range, when and only when the receiver receives an electromagnetic field of the predetermined wavelength or the predetermined wavelength range. In some embodiments, the receiver device comprises a coil or antenna, which has a length that is tuned to the predetermined wavelength or the predetermined wavelength range. The length of such an antenna equals a whole-number multiple of one-quarter or one-half, of the predetermined wavelength or a wavelength, especially an average wavelength, of the predetermined wavelength range in some embodiments.

One such organic light-emitting component is suitable as a display element for the operating state of a high-frequency system, for example, a transmission system, for example, for radio. The component can be constructed as a tag, which is fixed, for example, to clothing. Such a display element is suitable for warning maintenance personnel with an optical signal when they are in the irradiated area of a non-deactivated transmission system.

In another embodiment, the organic light-emitting component comprises a data-storage component, which is suitable for storing information.

In one embodiment, the data-storage component is suitable for storing one bit of information. For example, the data-storing component can be "intact" or "destroyed". The state ("intact" or "destroyed") of the data-storing component corresponds to a state ("1" or "0") of the stored bit. That is, the state of the data-storing component represents the bit of information which is stored and the state of the bit can only be switched one time. For example, in this case the data-storage device is a capacitor, for example, a film capacitor, which has, in particular, a desired short-circuit point. The capacitor can be part of an oscillator. The state of the capacitor can be detected by probing the resonance frequency of the oscillator. When the tag with the data-storage component passes a suitable transceiver, e.g., near the doors of a store, an electromagnetic field can be swept around the resonance frequency of the oscillator to which the capacitor belongs. If the tag is activated, i.e., the capacitor is intact, the oscillator will draw energy from the field at its resonance frequency and an alarm can be triggered. If the capacitor is destroyed, no extra energy will be drawn from the field at the resonance frequency.

In some embodiments, the same alternating electromagnetic field is capable of being received by the receiver device and causing the organic light-emitting component to emit electromagnetic radiation and to destroy the data-storing component. An organic light-emitting component with such a data-storing component is especially well suited as a security tag, for example, for securing goods. In some embodiments, the security tag is deactivated when the data-storing component is destroyed.

In another embodiment, the data-storage component is a semiconductor component and comprises, in particular, an integrated circuit. For example, the semiconductor component involves an RFID (Radio Frequency Identification) chip.

An organic light-emitting component with a data-storage component is suitable for emitting electromagnetic radiation—e.g., in the visible spectral range—when information is to be transmitted from or to the data-storage component. For example, advantageously a write and/or read operation on an RFID chip or the deactivation of a security tag can be indicated.

A device can include at least one organic light-emitting component and one control unit, which supplies the receiver device of the component in operation with electrical energy. The control unit can be galvanically separated, i.e., electrically insulated, from the organic light-emitting component, thus, there is no electrical connection between the component, especially the receiver device, and the control unit.

The separation of the component from the control unit advantageously allows the component or the control unit of the device to be individually replaced, for example, in the case of a defect. Also, replacement of the component with another organic light-emitting component that emits, for example, electromagnetic radiation with another spectral distribution, is possible in a simple way.

Electrical contacting of the component by means of wires or cables to electrical contact surfaces is advantageously not necessary here, in contrast to components of conventional construction. Such contact surfaces are usually thin metal films, so that they are susceptible to mechanical damage and corrosion. The appearance of wear and faults, which occur with components of conventional construction—especially those for frequent contacting—is advantageously prevented.

In some embodiments, the control unit is provided for generating an alternating electromagnetic field in operation from an alternating current and/or from a time-varying direct current. For this purpose, a time-varying magnetic field and/or electric field is generated, for example, by means of a coil and/or an antenna and is decoupled from the control unit. The alternating current or the time-varying direct current has, for example, a sinusoidal, rectangular, or triangular profile. In some embodiments, the alternating electromagnetic field generated by the control unit is inductively coupled into the receiver device of the organic light-emitting component. Alternatively, the alternating electromagnetic field can be capacitatively coupled to the receiver. In some embodiments, the frequency and/or the intensity of the alternating electromagnetic field is tuned to the receiver device. In this way, especially efficient coupling is achieved.

In some embodiments of the device with an organic light-emitting component with a data-storage component suitable for storing information, for example, an RFID chip, the device includes a control unit which is also suitable for transmitting information to the data-storage component and/or receiving information from this component. In some embodiments, the alternating electromagnetic field generated by the control unit is used for transmitting both the energy and the information. For example, the frequency, the phase, and/or the amplitude of the alternating electromagnetic field can be modulated in order to transmit the information. In an organic light-emitting component that constitutes a security tag, a control unit can be a deactivator which generates an alternating electromagnetic field that is suitable, in particular, for destroying the data-storage component.

In some embodiments, the receiver device is provided for receiving the transmitted information—for example, by means of demodulating the alternating electromagnetic field—and transmitting it to the data-storage component. In at least one embodiment, the receiver device is alternatively or additionally provided for transmitting information from the data-storage component to the control unit.

For example, for the transmission of information from the data-storage component to the control unit, in one embodiment, a variant of amplitude modulation designated as load modulation is used. For load modulation, the magnitude of the electrical energy received, for example, by the receiver device from the alternating electromagnetic field differs at different times. This is achieved, for example, by turning on and off a modulation resistor of the receiver device. The difference in energy drawn from the alternating electromagnetic field can be detected in this case by the control unit.

The frequency of the alternating electromagnetic field generated by the control unit equals, for example, between about 30 and 500 kHz or between about 10 and 15 MHz. These frequency ranges are especially advantageous when the organic light-emitting component contains a semiconductor component suitable for storing information.

In another embodiment, the organic light-emitting component is arranged in or on a holder. The holder can contain the control unit. For example, the holder can have an interior in which the control unit is arranged, or an outer face of the holder and an outer face of the control unit can be connected to each other in a mechanically stable way.

In one embodiment, the component is connected to the holder in a mechanically stable way. Thus, advantageously, a defined arrangement of the receiver device relative to the control unit is achieved, so that, for example, the alternating electromagnetic field can be coupled into the receiver device in an especially efficient way. The connection can be either reversible—in other words easy to detach—or irreversible, that is, one of the components is broken in order to break the connection. For example, the component can have at least one holding element, which has a support element connecting to the holder. In some embodiments, the connection of the holding element and support element can be easily detached, for example, in that the support element and/or the holding element are spring-mounted and/or have a flexible construction.

In another embodiment, the control unit is a high-frequency device. For example, the high-frequency device involves a microwave system. Such a high-frequency device is typically provided for irradiating objects with the alternating electromagnetic field generated by the device. The organic light-emitting component is arranged in the area irradiated by the alternating electromagnetic field, so that it is supplied with energy from the alternating electromagnetic field.

For example, the high-frequency device has an interior, in which, during operation, objects are inserted and irradiated with the alternating field generated by the high-frequency device. The organic light-emitting component can be located in this interior or adjacent to it, so that it is supplied with energy from the generated alternating electromagnetic field.

The organic light-emitting component is advantageously suitable for indicating the operating state of the high-frequency device. The component usually emits electromagnetic radiation precisely when the high-frequency device generates an alternating electromagnetic field. The intensity of the radiation emitted by the organic light-emitting component is dependent on the intensity of the alternating electromagnetic field in one embodiment. In other words, the component is used as an optical control display for such a high-frequency device.

In one variant of this embodiment, a plurality of organic light-emitting components is supplied with energy from one such high-frequency device as a control unit. The receiver unit of at least one component is here constructed so that the organic light-emitting component only emits electromagnetic radiation when the alternating electromagnetic field generated by the control unit exceeds a defined, minimum intensity. In one embodiment, the receiver units of a plurality of components are constructed so that they lead to an emission of electromagnetic radiation of the organic light-emitting components for different minimum intensities of the alternating electromagnetic field generated by the control unit. For example, the coils or antennas of the receiver devices have different geometries and/or different numbers of windings. In this embodiment, advantageously, conclusions can be drawn on the intensity of the electromagnetic radiation generated by the control unit from the pattern formed by the operating state of the components.

In some embodiments, a lighting device includes at least one organic light-emitting component. Such a lighting device advantageously needs no electrical supply lines in the surroundings of the light-emitting surface. In particular, no electrically conductive leads and/or supply lines lead to the organic light-emitting component to supply this component with energy.

In some embodiments of the lighting device, a control device, which supplies the organic light-emitting component with energy by means of an alternating electromagnetic field, is provided, for example, on an edge region of the lighting device.

For example, the organic light-emitting component is arranged on a middle area of a glass plate. The middle area of the glass plate, such as the entire glass plate, can then be free from electrical supply lines, especially from electrically conductive leads.

According to some embodiments, a lighting device comprises a plurality of organic light-emitting components. These can be arranged flush with each other at least in one direction in the plane of the main extent of the layer stack and together form one or more lighting surfaces. The lighting surface here can be either flat or curved. In some embodiments, the lighting device represents a display device.

In some embodiments, the layer stack of a component has essentially the same dimensions as the component itself in the plane of the main surface, at least along the direction or the directions, in which the components are arranged flush relative to each other. "Essentially the same dimensions" here also includes the sense that the component has, for example, an edge region, at which, for example, the cap and substrate are adhered and which is free from the layer stack. Such an edge region can, however, be particularly narrow. That is, the layer stack can have smaller dimensions than the substrate or cap, and the difference between the dimensions of the cap or substrate and the layer stack dimensions is made up by the adhesion region between the substrate and cap in some embodiments.

In some embodiments, the outer surfaces of the component have no electrical contact surfaces. In other words, there are neither contact surfaces that are arranged laterally next to the layer stack of a component in a plan view onto the substrate, nor are electrical contact surfaces constructed on the rear side of the components facing away from the radiation-emitting side. The surface of non-illuminating areas between the layer stacks of the individual components is therefore especially small or not present. Advantageously, the viewer does not perceive or does not clearly perceive the boundaries between the individual components. Thus, advantageously large, essentially uniformly illuminating surfaces can be produced with organic light-emitting components. In addition, advantageously, no electrically conductive lines or the like are guided outwards from the encapsulated interior of the component, where these lines or the like represent permeation channels, along which water, atmospheric oxygen, and/or other corrosive substances penetrate the component and lead to accelerated degradation of the layer stack. The lighting device therefore has a particularly long service life.

In contrast to conventional lighting devices or display devices, it is not necessary to connect the individual components to driver electronics electrically by means of cables, such as, for example, ribbon cables. Advantageously, the time required for the production of the lighting device is shortened and economical production is possible.

In some embodiments, the lighting device comprises one or more holders, in or on which the organic light-emitting components are arranged. A holder can comprise a control unit, which supplies an organic light-emitting component or a plurality of components with energy. In some embodiments, a holder and/or a control unit is allocated to each component.

In one embodiment, the lighting device comprises organic light-emitting components, which emit in different spectral regions. With one such lighting device, in a simple way, different patterns can be generated.

For producing the organic light-emitting component, in some embodiments, the substrate is provided in the form of a plate or a film, as described above. A substrate in the form of a film can be provided as a continuous film that is, for example, wound onto a roller. In this way, an economical production of the components is possible in an "endless method" (roll-to-roll process).

A first electrode is deposited over or directly onto the substrate. In the production of a plurality of components with the method, a first electrode layer is deposited in a structured way or structured into individual first electrodes after being deposited over the entire surface.

On the first electrode, a layer stack is produced, which comprises an organic material, e.g., a low-molecular weight material ("small molecules") and/or a polymer. Low-molecular weight materials can be vapor deposited onto the electrode. Polymers can be deposited using a wet-chemical process, such as spin-coating. Also, various printing technologies, for example, plate-transfer printing methods, such as offset printing, pad printing, letterpress printing and gravure printing, for example, flexographic printing, or inkjet printing methods, are suitable for applying the layer stack.

Such printing methods are described, for example, in WO 99/07189 A1 the contents of which are incorporated herein by reference.

In some embodiments, an organic layer sequence is applied over the entire surface and then removed from the substrate in some areas, so that a layer stack or—for the production of a plurality of components—a plurality of layer stacks remains. The removal of the organic layer sequence in some areas is performed, for example, by a mechanical process, e.g., with metal blades. Alternatively, a solvent can also be used, which is applied, for example, through a mask or the layer sequence is removed in some areas by means of laser ablation. Here, a laser in the ultraviolet spectral range can be used, such as a laser with wavelengths between about 300 and 400 nm. Preferably, a sub-area of the first electrode is also exposed.

Alternatively, a layer stack or a plurality of layer stacks can also be generated through structured deposition of an organic layer sequence onto the substrate. Here, the printing methods named above are especially suitable. In particular, low-molecular weight organic materials can also be deposited through thermal vaporization, especially through a mask, onto the substrate. A sub-area of the first electrode can remain uncovered by the layer stack during its structured deposition.

Then an encapsulation is deposited onto the substrate and the layer stack. For example, a sequence of organic and inorganic layers, as are described above, is deposited onto the layer stack and onto the substrate. The sequence of organic and inorganic layers can completely cover the side of the substrate facing the layer stack.

Alternatively, an encapsulating structure or laminate can also be deposited, which is a plate or a film. Examples for such encapsulating structures are described above. If the encapsulation involves, for example, a plate, then this can have a recess, which is suitable for accommodating the layer stack, in other words the recess forms a cavity in which the layer stack is located. On the side of the encapsulation facing the layer stack, optionally, a better material can be deposited, as described above, in particular in the area of the recess. The encapsulation here requires advantageously no apertures or cut-outs, e.g., for electrical contact surfaces to the outer surface of the component. In some embodiments, in the plane of the main extent of the layer stack it has the same dimensions as the substrate.

For the production of a plurality of organic light-emitting components, the encapsulation can be formed as a continuous encapsulation applied to a plurality of layer stacks. In some embodiments, the continuous encapsulation involves a plurality of encapsulations of individual components, which are constructed in an integrated way. The continuous encapsulation can be a simply connected area and with no cut-outs or apertures. In some embodiments, the encapsulation is applied over the entire surface of the substrate.

In one embodiment, a composite that includes the substrate, the layer stack, and the continuous encapsulation is separated into individual parts by cuts forming individual organic light-emitting components, where the cuts severe both the substrate and also the continuous encapsulation. If the first electrode layer has not already been structured in a previous processing step, the cuts can also simultaneously structure the first electrode layer into individual first electrodes. The method thus advantageously allows simple partitioning of the composite into individual components by means of straight-line cuts.

The substrate is connected to the encapsulation, for example, by means of a bonding agent, which is deposited onto the substrate and/or the encapsulation in some areas, e.g., in the form of a bonding agent bead. The bonding agent can be a bonding agent that can be cured thermally and/or optically, for example, on the basis of an epoxy resin or on the basis of solder glass. The curing process can include heating and/or irradiating the bonding agent with electromagnetic radiation, especially in the infrared and/or ultraviolet spectral range. In one embodiment, the electromagnetic radiation is from a laser. The electromagnetic radiation can be focused and/or masked in some areas, so that, for example, essentially only the positions of the substrate and/or the encapsulation covered with bonding agent are irradiated. Such methods are described for encapsulating individual components, for example, in US 2006-0105493 A1, the contents of which is incorporated herein by reference.

The bonding agent can be irradiated through the substrate and/or through the encapsulation. Advantageously, there are no conductive leads, electrical supply lines, or the like adjacent to the bonding agent. Such electrical supply lines and/or conductive leads can disrupt the curing of the bonding agent. For example, the conductive leads usually have different optical, thermal, and/or physical properties than the substrate and/or the encapsulation. Because in the present case the bonding agent does not extend over electrical supply lines and/or conductive leads and also does not have to be irradiated through such features, the irradiation or heating of the bonding agent is uniform across the entire bonding agent and homogeneous curing of the bonding agent can be achieved. Thus, an especially hermetic encapsulation is possible.

Alternatively, the encapsulation can be fused or connected to the substrate, for example, by supplying heat and/or by means of a suitable chemical reaction, which, for example, etches the encapsulation and/or the substrate, especially by means of an etching process. Advantageously, in contrast to conventional components, in the area to be connected there are no electrically conductive leads and/or contact surfaces, which could become detached or destroyed in the use of such connecting techniques.

Figure 1B:
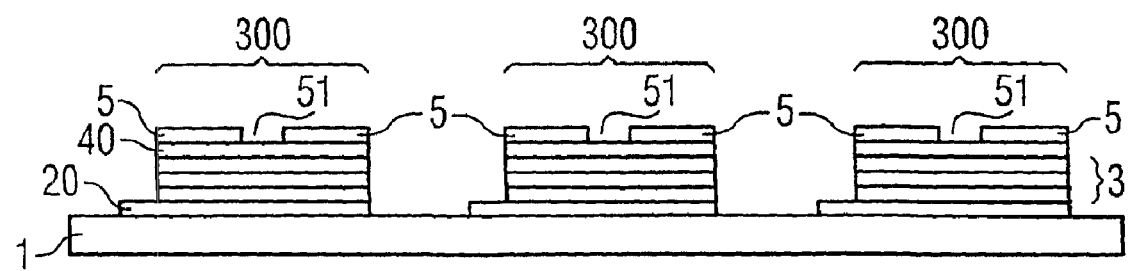
Figure 1B:

Referring to FIGS. 1A and 1B, according to one embodiment, a substrate 1, such as a glass plate is provided and a first electrode layer 2 is deposited on the substrate 1. The first electrode layer 2 can be a layer made from indium-tin oxide (ITO), which is deposited onto the substrate 1, such as by a sputtering process. The first electrode layer 2 is structured to form first electrodes 20, which are suitable to be used as anodes because of the ITO material.

On the first electrode layer 2, an organic active layer sequence 3 is deposited, such as by a vaporization process. The layer sequence 3 has a hole transport layer 31, which includes, for example, 1-naphDATA and/or α-NPD, adjacent to the first electrode layer 2. The active layer sequence 3 also has an active layer 32 suitable for generating radiation and which can include a small molecule material suitable for the emission of electromagnetic radiation, such as $Alq_3$ and/or DPVBi. The active layer sequence 3 further comprises an electron transport layer 33, which has, for example, $Alq_3$ and/or BPhen. Adjacent to this is a second electrode layer 4, which can also be applied onto the organic active layer sequence 3 using a vaporization process.

Alternatively, the layer sequence 3 can be deposited using a spinning process. In some embodiments, a layer sequence 3 suitable for spinning has only two layers, which include, for example, a polymer. The two layers are, for example, a hole transport layer 31 adjacent to the first electrode layer 2 and an active layer 32. The hole transport layer 31 can include PEDOT and/or the active layer 32 can include PPV and/or polyfluorene. In some embodiments, the layer sequence also includes at least one third layer, for example, an electron transport layer 33. At least one of the layers in the layer sequence can have at least one polymer which is cross-linkable. For example, the cross-linkable polymer can be cross-linked through irradiation with electromagnetic radiation. In other words, it is photo-cross-linkable. After cross-linking the cross-linkable polymer, the layer that includes the cross-linkable polymer is advantageously insoluble in a solvent that is used for depositing the following layer.

The thickness of the organic layer sequence 3 can be less than or equal to 500 nm or less than or equal to 200 nm.

Cathodes 40 are produced through subsequent structuring of the second electrode layer 4. The second electrode layer 4 comprises a thin injection layer of an alkali or alkaline-earth metal, for example, calcium, and a cover layer, which includes, in the present case, aluminum and/or silver.

As shown in FIG. 1B, the organic layer sequence 3 is structured into individual layer stacks 300, wherein, in the present case, sub-areas of the first electrodes 20 are also exposed. The structuring can be achieved by, for example, laser ablation. In the structuring step, in the present case, the second electrode layer 4 and the first electrode layer 2 are also structured into second electrodes 40 and first electrodes 20. Alternatively, the first and/or the second electrode layer 2, 4 can be structured during the deposition. The structuring of the organic layer sequence 3 into individual layer stacks 300 can alternatively also be realized before the deposition of the second electrode layer 4.

Figure 2A:
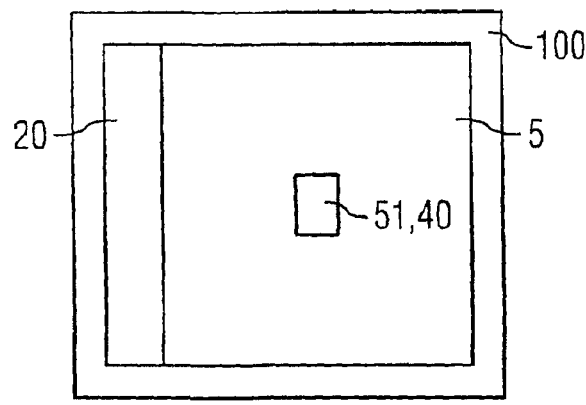
FIGS. 2A and 2B, are schematic plan views of a component for the stages of the method shown in FIGS. 1B and 1C.

An insulating layer 5 is then deposited onto the second electrode 40 of a layer stack 300. In the present example, this processing step and the subsequent processing steps are executed at the same time or sequentially, for a plurality of layer stacks 300, or for all of the layer stacks 300. The insulating layer in the present example has a recess 51, which leaves open a middle area of the second electrode 40 (cf. also FIG. 2A). The insulating layer can be deposited by vaporization or sputtering. It has, for example, $Al_2O_3$, polytetrafluoroethylene, PS and/or PMMA or is formed entirely of one of these materials. Alternatively, the insulating layer can also involve a self-assembled monolayer.

Figure 1C:
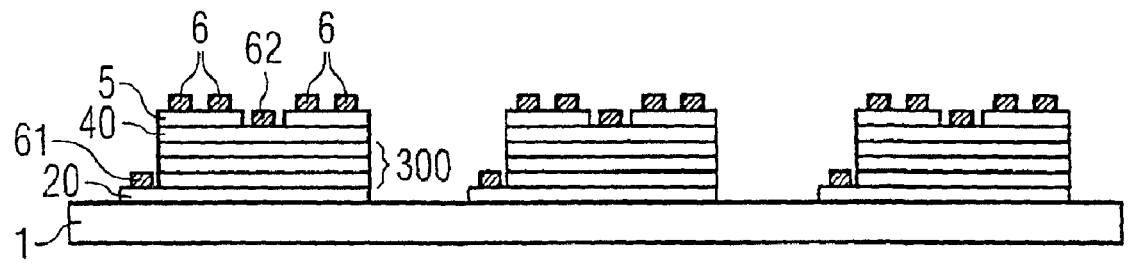
Figure 1C:
Figure 2B:
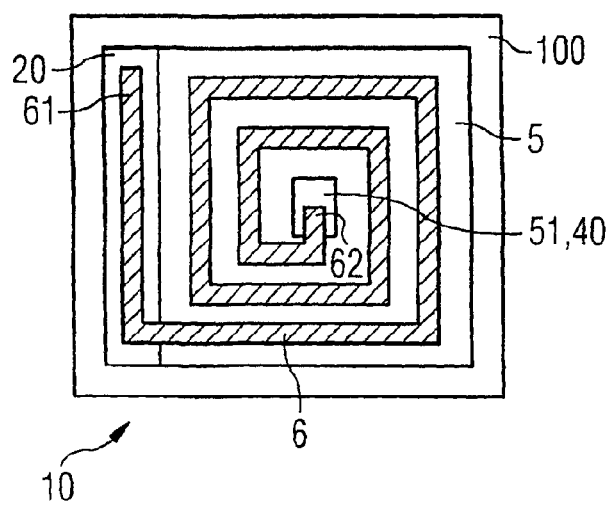

On the exposed sub-area of the first electrode 20, the insulating layer 5, and the middle part of the second electrode 40, a conductive line which forms antenna 6 is formed such as by vapor deposition through a mask (cf. FIG. 1C). For example, the conductive line includes aluminum, silver, gold, and/or copper or is composed entirely of one of these materials. In the present example the conductive line has the shape of a rectangular spiral, as shown in FIG. 2B.

A first end 61 of the conductive line is located on the exposed sub-area of the first electrode 20 and a second end 62 of the conductive lead is located on the middle area of the second electrode 40 in the recess 51 of the insulating layer 5. The conductive line forms an antenna 6, which connects the first and the second electrode 20, 40 by means of their ends 61, 62 in an electrically conductive way. The substrate 1 is free from additional conductive lines in the present example.

Figure 1D:
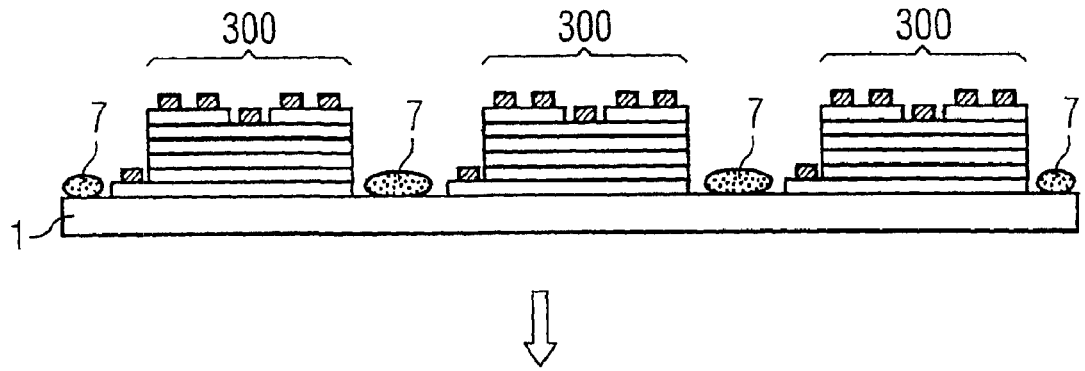

A bonding agent 7 is deposited onto the substrate 1 in select areas, as shown in FIG. 1D. In some embodiments, the bonding agent completely surrounds the layer stack 300 on the main surface of the substrate 1. The bonding agent can be cured, for example, through irradiation, for example, ultraviolet or infrared radiation, and/or through heating. The bonding agent 7 includes, for example, an epoxy resin.

Figure 1E:
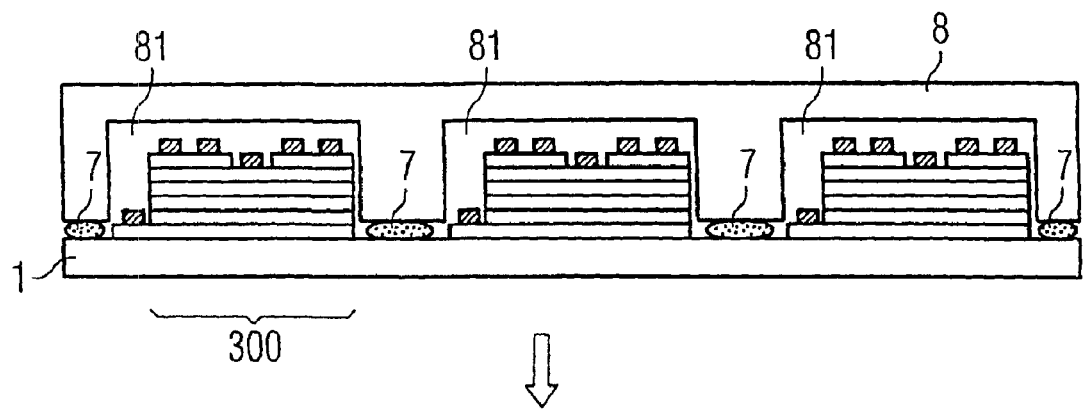

Then a continuous encapsulation 8 is deposited onto the substrate 1 (cf. FIG. 1E). The continuous encapsulation 8 is composed of glass in the present example and has recesses 81, each of which is suitable for accommodating one layer stack 300. The continuous encapsulation 8 is arranged on the substrate 1, such that the layer stacks 300 are located in the recesses 81. In the present example, the dimensions of the main surface of the substrate 1 and the continuous encapsulation 8 are the same in top view on the main surface of the substrate 1, and the edges of the substrate 1 and the continuous encapsulation 8 are arranged flush relative to each other, so that they are congruent in the plan view onto the substrate 1. The areas between the recesses 81 on the side of the continuous encapsulation 8 facing the substrate 1 are wetted at least partially by the bonding agent 7 before the bonding agent is cured or hardened.

Then the bonding agent 7 is cured so that a mechanically stable connection is produced between the continuous encapsulation 8 and the substrate 1. The layer stack 300 is here enclosed in the recess 81 so that to the greatest possible extent, water, atmospheric oxygen, and other corrosive substances cannot penetrate the recess 81 from the outside.

The bonding agent 7 can be cured, for example, by irradiation with electromagnetic, e.g., ultraviolet, radiation. The irradiation is performed, for example, by means of a UV lamp, especially for large-area irradiation, or by means of a laser, whose radiation is, in particular, focused. This is described, for example, in US 2006-0105493 A1, the contents of which is incorporated herein by reference. In some embodiments, the bonding agent 7 is irradiated through the carrier substrate 1 and/or through the continuous encapsulation 8. Advantageously, no conductive lines or the like are located in the beam path of the electromagnetic radiation at positions to be bonded, so that the irradiation of the bonding agent 7 is performed in all locations as uniformly as possible. In this way, homogeneous curing of the bonding agent 7 is achieved, whereby a hermetic encapsulation is produced.

Figure 1F:
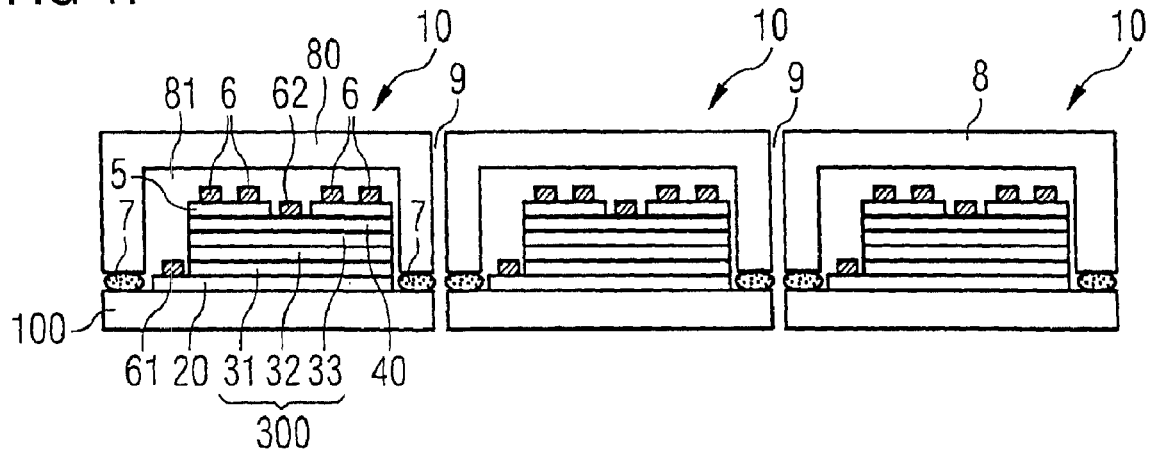

Then the layer stacks 300 are separated into individual organic light-emitting components 10 by forming cuts 9 through the continuous encapsulation 8, the bonding agent 7, and the substrate 1 (cf. FIG. 1F). In the present example, only in this processing step is the substrate 1, that is, the carrier substrate for the plurality of layer stacks, divided into individual substrates 100 and the continuous encapsulation 8 into individual caps 80.

The component 10 advantageously has no external contact surfaces. Therefore, complicated removal of the organic layer sequence from such contact surfaces is eliminated and no sub-area of the substrate 100 need be provided for holding such contact surfaces. The cap 80 and the substrate 100 can therefore, as shown in FIG. 1F, have a positive fit. In addition, there are no electrically conductive tracks, which must be guided between the cap 80 and the substrate 100 out of the interior of the component formed by the recess 81 of the cap 80 to the exterior, and which, for organic light-emitting components of conventional construction, can represent diffusion channels along which atmospheric oxygen and water can penetrate the interior 81 of the component and accelerate the aging of the layer stack 300.

Figure 2C:
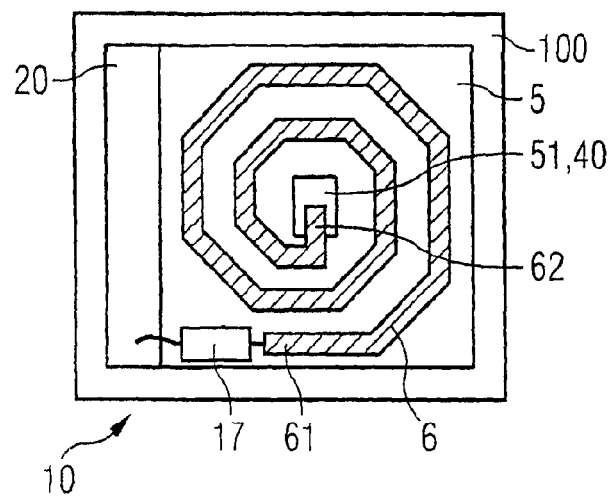
FIG. 2C is a schematic plan view of a component according to a variant of the first embodiment.

In one variant of this embodiment, the antenna 6 has the shape of an octagonal spiral, as shown in FIG. 2C.

As an example, in FIG. 2C an electronic component 17 is also shown, which is arranged in the present case between the first electrode 20 and the first end 61 of the antenna 6, for example, on the side of the layer stack 300 facing away from the substrate 100. Alternatively, the electronic component 17 can also be arranged laterally next to the layer stack 300 on the substrate 100.

In some embodiments, the electronic component 17 includes a diode, which is provided for rectifying the current directed into the layer stack 300. The diode 17 is electrically connected to the first electrode 20 and to the first end 61 of the antenna 6, such as by bonding or soldering the electronic component 17 and/or connection wires thereof, thus completing the current loop.

Alternatively, such an electronic component 17 or a circuit made from several such components 17 can also be constructed in a layered structure, in order words, as a sequence of layers, such as semiconductor layers. The layered structure can include an epitaxial semiconductor layer sequence. At least one layer of the sequence of layers may be structured in one embodiment. For example, the layered structure, can be arranged between the layer stack 300 and the first electrode 20.

Figure 3A:
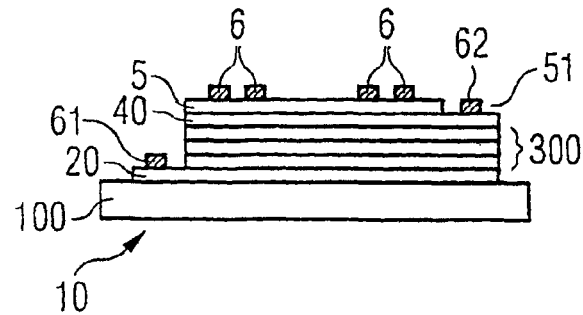
FIG. 3A is a schematic cross section through an organic light-emitting component according to another embodiment.
Figure 3B:
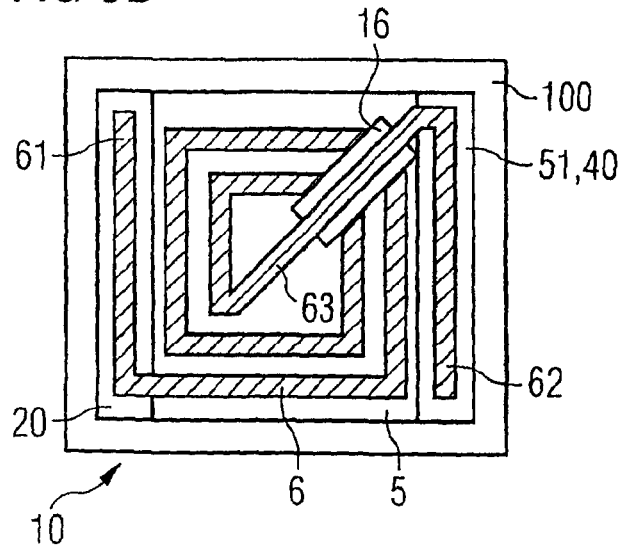
FIG. 3B is a schematic plan view onto the organic light-emitting component of FIG. 3A.

In the organic light-emitting component 10 according to the embodiment of FIGS. 3A and 3B, instead of a middle area, as in the preceding embodiment, an edge region 51 of the second electrode 40 remains uncovered by the insulating layer 5. The antenna is constructed as a rectangular spiral made from conductive lines. Starting from a first end 61 of the antenna 6, which is electrically connected to the first electrode 20, on the insulating layer 5 there are windings that extend in the shape of a spiral from an edge region of the insulating layer 5 to a middle area of the insulating layer 5. From there, a connection piece 63 of the antenna 6 runs back to the edge of the insulating layer 5 and transitions into the second end 62, which is arranged in the recess 51 of the insulating layer 5. The second end 62 is electrically connected to the second electrode 40. Between the connection piece 63 and the windings of the antenna 6 there is a separating layer 16, which electrically insulates the connection piece 63 from the windings over which it runs. Thus, short-circuiting of the antenna 6 is prevented by the connection piece 63.

Figure 3C:
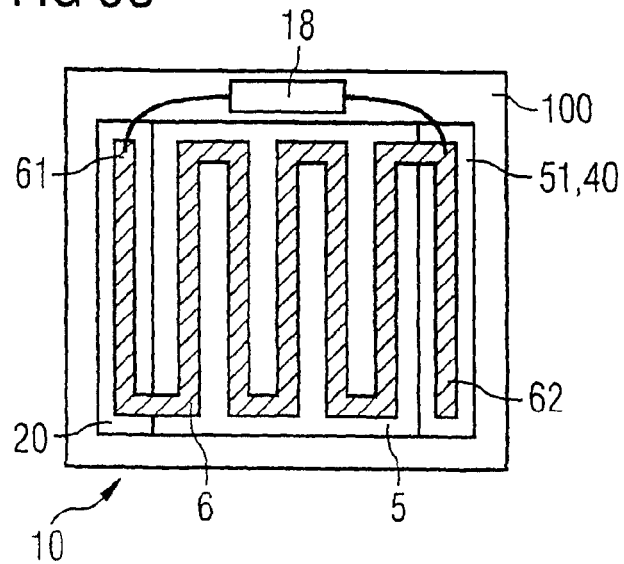
FIG. 3C is a schematic plan view onto a variant of the organic light-emitting component according to FIGS. 3A and 3B.

In FIG. 3C, a variant of this embodiment is shown. In contrast to the embodiment of FIGS. 3A and 3B, the antenna 6 is constructed in this embodiment as a square wave, which is electrically connected to the exposed part of the first electrode 20 and extends from the first electrode 20 to the recess 51 of the insulating layer 5 arranged on the opposite side of the organic layer stack 300, where it is also electrically connected to the second electrode 40.

FIG. 3C also shows a data-storage component 18, for example, a film capacitor with a desired short-circuit point or an RFID chip, which is connected electrically to the first end 61 and to the second end 62 of the antenna 6 in a parallel circuit to the layer stack 300, for example, by means of connection wires and/or through solder or bonding. Thus, the alternating electromagnetic field received by the antenna 6 is advantageously also coupled into the data-storage component 18. For example, the data-storage component 18 is arranged on the substrate 100 next to the layer stack 300 or is adjacent to the side of the layer stack 300 facing away from the substrate 100.

An electronic component 17, which is, for example, a capacitor provided for voltage smoothing, can also be connected electrically like the data-storage component 18 in a parallel circuit to the layer stack 300.

The constructions of the recesses 51 and the antenna 6 are not limited to the geometries described in the first and second embodiment. Instead, they can be adapted accordingly to the corresponding requirements.

Figure 4:
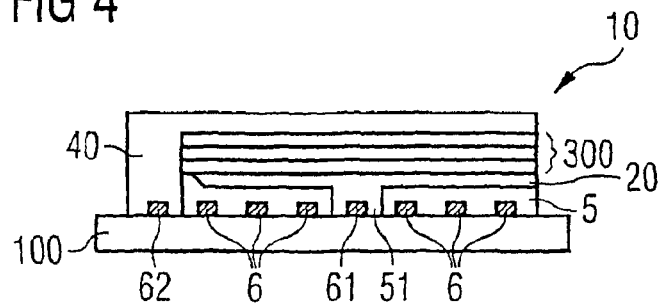
FIG. 4 is a schematic cross section through an organic light-emitting component according to a third embodiment.

In the embodiment shown in FIG. 4, the antenna 6 is not arranged as in the first two embodiments on the side of the second electrode 40 facing away from the substrate 100. Instead the antenna is located between the substrate 100 and the layer stack 300. Then the first electrode 20 is arranged on the antenna 6. An insulating layer 5 separates the antenna 6 from the first electrode 20. Here, the insulating layer 5 has a recess 51 into which the first electrode 20 extends. A first end 61 of the antenna 6 is also located in the recess 51, so that an electrical contact is established between the first electrode 20 and the antenna 6.

Then the layer stack 300 is deposited onto the first electrode 20. On this layer stack follows the second electrode 40.

The second end 62 of the antenna projects in this embodiment laterally past the layer stack 300, so that contact is established with the second electrode 40, which, in the present example, is not only arranged on the layer stack 200, but also is drawn laterally past the layer stack towards the second end 62 of the antenna 6.

While electromagnetic radiation generated by the layer stack 300 during operation in the organic light-emitting component according to the first and the second embodiment according to FIGS. 1A-3C is transmitted through the first electrode 20 and the substrate 100 ("bottom emitter"), the transmission of the electromagnetic radiation in the component 10 according to the embodiment of FIG. 4 is essentially through the second electrode 40 ("top-emitter"). In this embodiment, therefore, the substrate 100 need not be transparent. The first electrode 20 can have a reflection coefficient that is as high as possible. In contrast, the second electrode 40 is at least partially transparent or translucent to electromagnetic radiation generated by the layer stack 300 during operation. In one construction of the embodiment in FIG. 4, the second electrode 40 represents the anode and includes, for example, from indium-tin oxide. The first electrode 20 then is the cathode and includes, for example, aluminum.

Figure 5A:
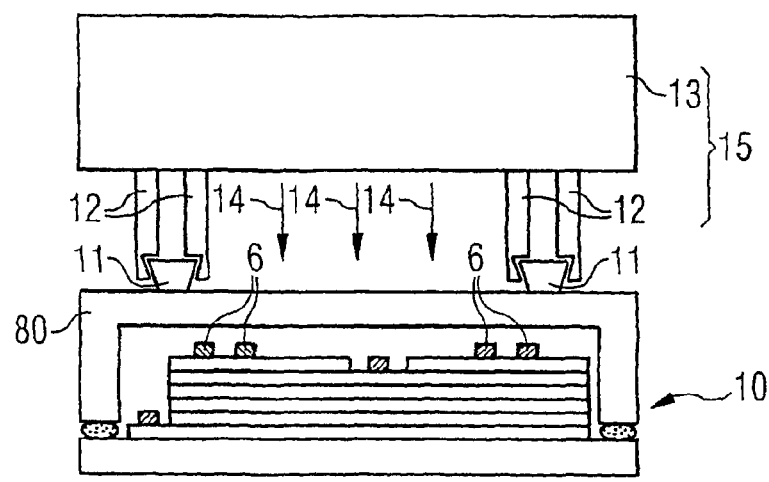
FIG. 5A is a schematic cross section through a device with an organic light-emitting component according to a first embodiment.

The device according to the first embodiment shown in FIG. 5A comprises an organic light-emitting component 10, which is arranged in a holder 15 by means of holding elements 11. The holding elements 11 are constructed in the present case as projections from the encapsulation 80. These projections engage in fitting recesses of flexible support elements 12 of the holder 15, preferably with a positive fit. Thus, a simple and reproducible alignment of the component 10 can be achieved. At the same time, the component can be removed in a simple way from the holder 15. Thus, if the component is defective, it can be easily replaced, and the device can be tailored to a user's needs, allowing the user to use components 10 with different colors and/or shapes, because the components can be easily interchanged.

In the present case, the holder 15 also includes a control unit 13, which supplies the organic light-emitting component 10 with energy. The control unit 13 and the component 10 are not electrically connected to one another. Instead, energy is supplied through an alternating electromagnetic field (indicated by arrows 14), which is generated by the control unit 13 by means of a coil and/or antenna from an alternating current or a time-varying direct current and which is emitted by the control unit 13. In the present case, the alternating electromagnetic field 14 is inductively coupled into the organic light-emitting component 10 and is received by the receiver device, which in the present case comprises an antenna formed from conductive lines 6. The antenna 6 draws energy from the alternating electromagnetic field 14 and converts this energy into electrical energy. Current is therefore directed into the layer stack 300, which excites the active layer 32 into emitting electromagnetic radiation.

Electrical contacting by means of bonding pads or the like on the outer surfaces of the component, which is susceptible to defects and is time-consuming, is advantageously unnecessary.

Figure 5B:
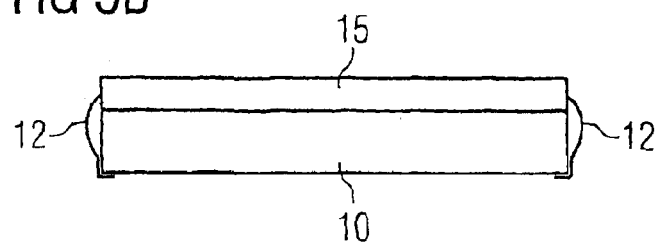
FIG. 5B is a schematic cross section through a device with an organic light-emitting component according to another embodiment.

In the device according to the embodiment of FIG. 5B, the organic light-emitting component 10 is fixed with support elements 12, for example, metal clamps, to the holding device 15, especially in an easily detachable way. The holder 15 advantageously has a small overall height. In the present case, an outer surface of the holder 15 is adjacent to a main surface of the encapsulation 80 or the substrate 100; for example, they border each other. In this way, a particularly small height of the device is advantageously achieved.

Figure 5C:
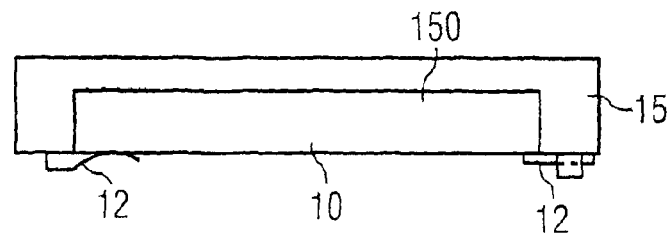
FIG. 5C is a schematic cross section through a device with an organic light-emitting component according to a variant of the embodiment of FIG. 5B.

In the variant of this embodiment shown in FIG. 5C, the organic light-emitting component 10 is arranged in a recess 150 of the holder 15. The component 10 partially or completely fills the recess 150. In particular, the outer face of the component 10 exposed by the holder 15 and the sub-area surrounding the recess 150 of the face of the holder 15, which includes the recess 150, lie essentially in one plane. For example, at least one support element 12 fixes the component 10 in the holder 15.

In FIG. 5C, as an example for a support element, a clamp 12, such as a metal clamp is shown on the left side of the figure. The clamp 12 is fixed on the sub-area of the holder 15 surrounding the recess 150 and extends past the edge of the component 10 on its surface exposed by the holder 15.

On the right side of the figure, as another example, a locking bar 12 is shown, which is composed of, for example, a plastic material. The locking bar 12 is fixed to the holder 15 so that it moves parallel to the exposed surface of the component 10. An especially simple replacement of the component 10 is possible with such a locking bar 12.

For example, for an organic light-emitting component that is a security tag, the connection with the component 10 is realized with the holder 15, for example, by means of a bonding agent. The holder 15 is in particular a good or item, e.g., a retail item, to be secured from theft or loss. In this case, the connection preferably is not easily detachable.

Particularly when the device comprises an organic light-emitting component 10 with a data-storage component 10, as in this case, the holder 15 preferably does not contain the control unit 13. In some embodiments, the organic light-emitting component 10 is inserted into an area irradiated by the control unit 13 with the alternating electromagnetic field 14, for example, placed on a surface or moved past a surface.

Figure 6:
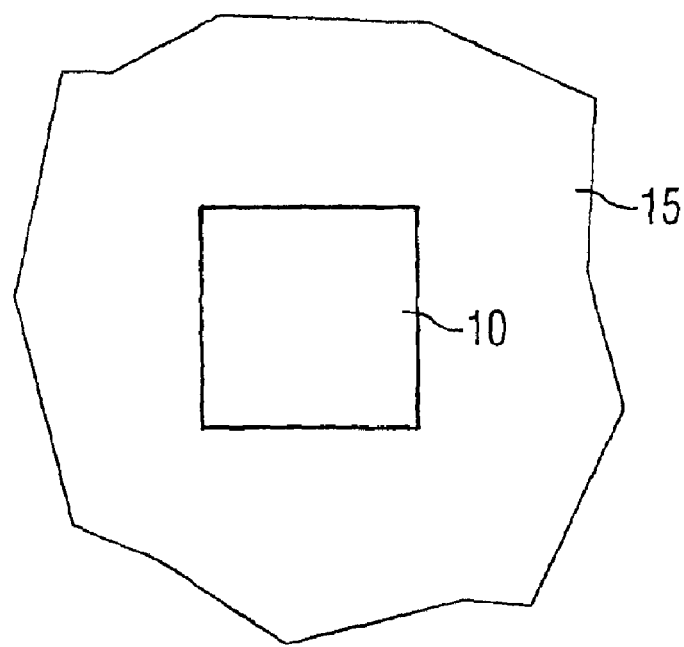
FIG. 6 is a schematic plan view of a cutout of a lighting device according to a first embodiment.

A light device according to the first embodiment shown in FIG. 6 comprises an organic light-emitting component 10, an entire face of which is connected to a holder 15, like a glass plate in the present example. The connection can be established, for example, by means of an adhesive film. The holder 15 here has no electrically conductive leads or supply lines adjacent to the organic light-emitting component 10. In particular, no electrically conductive leads and/or supply lines lead to the organic light-emitting component in order to supply it with energy.

In one variant of this embodiment, the holder 15 comprises a control unit 13, which represents a microwave system. For example, such a microwave system comprises an interior, in which objects can be placed, in order to be irradiated with the alternating electromagnetic field generated by the microwave system, and a door, which closes off the interior and which is transparent or translucent to light, for example, at least in some areas.

The organic light-emitting component 10 is arranged in the present case in the interior of the microwave system, such as on the side of the door of the microwave system facing the interior, especially at a position of the door that is transparent or translucent to light. In this way, the alternating electromagnetic field 14 generated by the microwave system is inductively coupled into the component 10, so that this is supplied with energy. Such an organic light-emitting component is especially well suited for indicating the operating state of the microwave system.

In another variant, the high-frequency device is an induction cooker. The induction cooker has, for example, a cooking surface 15. The organic light-emitting component 10 is arranged, for example, on the cooking surface 15. It is located within the area irradiated by the high-frequency device with the alternating electromagnetic field and advantageously indicates the operating state of the induction cooker.

Instead of an individual organic light-emitting component 10, for example, a plurality of components 10 can be provided for displaying the operating state of the high-frequency device. In particular, the components 10 are constructed in this case so that the intensity of the alternating electromagnetic field can be read from the lighting pattern of the components.

Figure 7:
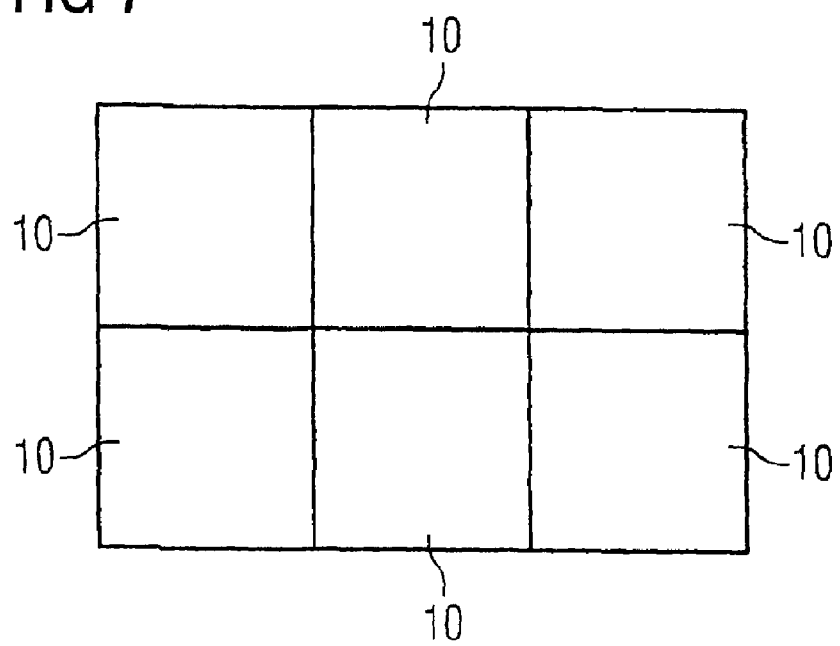
FIG. 7 is a schematic plan view of a cutout of a lighting device according to a second embodiment.

A lighting device according to a second embodiment comprises a plurality of organic light-emitting components 10. These are arranged in the plane of the main extent of the layer stack 300 flush relative to each other. FIG. 7 shows a cutout of one such lighting device.

Because the organic light-emitting components do not have external contact surfaces, electromagnetic radiation emitted from the active layer 32 of the layer stack 300 is coupled out from a large part, and in some embodiments essentially from the entire visible surface of the component 10. The lighting device therefore has the most uniform lighting surface possible, in which the segments of the lighting surface formed by the individual components 10 are not perceived by the viewer as clearly separate.

The invention is not limited to the embodiment examples in the description. Instead, the invention comprises any new feature and also any combination of features, which contains, in particular, each combination of features in the claims, even when this feature or this combination itself is not explicitly specified in the claims or embodiments.

What is claimed is:

1. An organic light-emitting component, comprising:
    a substrate;
    a first electrode arranged on the substrate;
    a layer stack arranged on the first electrode, which has at least one layer that includes an organic material and that is capable of generating electromagnetic radiation,
    a second electrode arranged on the layer stack;
    an insulating layer that at least partially covers the second electrode; and
    a receiver device that draws energy from an alternating electromagnetic field and converts the energy at least partially into electrical energy, and that injects the electrical energy for generating the electromagnetic radiation into the layer stack,
    wherein the receiver device comprises a coil, and
    wherein the layer stack, the second electrode, the insulating layer and the receiver device are all at least partially stacked on top of each other.

2. The organic light-emitting component of claim 1, wherein the receiver device comprises a plurality of coils forming a spiral having an average diameter decreasing in a direction to a center of the second electrode as seen in a top view.

3. The organic light-emitting component of claim 1, wherein the receiver device is configured to rectify alternating current.

4. The organic light-emitting component of claim 1, further comprising an encapsulation on the substrate and enclosing the layer stack together with the substrate.

5. The organic light-emitting component of claim 1, further comprising a data-storage component suitable for storing information.

6. A device, comprising:
the organic light-emitting component of claim 1; and
a control unit, which in operation generates an alternating electromagnetic field that is received by the receiver device.

7. The organic light-emitting component of claim 2, further comprising an insulating layer that at least partially covers the second electrode, and on which the receiving device is located, wherein each spiral is at least partially disposed on the insulating layer and each spiral at least partially overlaps, as seen in the top view, with each of the second electrode, the layer stack, and the insulating layer.

8. The organic light-emitting component of claim 2, wherein the receiver device is tuned to detect an alternating electromagnetic field of a predetermined wavelength or of a predetermined wavelength range.

9. The organic light-emitting component of claim 7, wherein the insulating layer covers an edge region of the second electrode and exposes a center area of the second electrode.

10. The organic light-emitting component of claim 7, wherein the insulating layer exposes an edge region of the second electrode.

11. The organic light-emitting component of claim 9, wherein the receiving device is connected to the center area of the second electrode.

12. The organic light-emitting component of claim 10, wherein the receiving device is connected to the edge region of the second electrode.

13. The organic light-emitting component of claim 3, in which the receiver device comprises at least one diode for rectification.

14. The organic light-emitting component of claim 4, wherein the encapsulation completely covers a main surface of the substrate.

15. The organic light-emitting component of claims 4, wherein a surface of the substrate and encapsulation is free from electrical contact surfaces.

16. The organic light-emitting component of claim 14, wherein the encapsulation and the substrate have flush edges relative to each other in a plan view of the substrate.

17. The organic light-emitting component of claim 8 wherein the receiving device has a length that is a whole-number multiple of one-quarter of the predetermined wavelength or a wavelength of the predetermined wavelength range.

18. The device of claim 6, wherein the organic light-emitting component is electrically insulated from the control unit.

19. The device of claim 6, wherein the control unit generates the alternating electromagnetic field from an alternating current or from a time-varying direct current.

20. The device of claim 6, further comprising a holder connected to the organic light-emitting component.

21. The device of claim 6, wherein the control unit is a high-frequency device, which in operation irradiates an area with the alternating electromagnetic field, and the high-frequency device is provided for irradiating objects with the alternating electromagnetic field and the organic light-emitting component is in the area.

22. A lighting device comprising a device of claim 6.

23. The device of claim 19, wherein the alternating electromagnetic field generated by the control unit is inductively coupled into the receiver device.

24. The device of claim 20, wherein the holder contains the control unit.

25. The lighting device of claim 22, wherein a plurality of organic light-emitting components are arranged adjacent and flush relative to each other at least in one direction.

\* \* \* \* \*

UNITED STATES PATENT AND TRADEMARK OFFICE
CERTIFICATE OF CORRECTION

PATENT NO. : 7,994,715 B2  Page 1 of 1
APPLICATION NO. : 11/755558
DATED : August 9, 2011
INVENTOR(S) : Buchhauser et al.

It is certified that error appears in the above-identified patent and that said Letters Patent is hereby corrected as shown below:

Column 22, line 1, delete "claims" and insert -- claim --.

Signed and Sealed this
Fourth Day of October, 2011

David J. Kappos
*Director of the United States Patent and Trademark Office*